Figure 1:
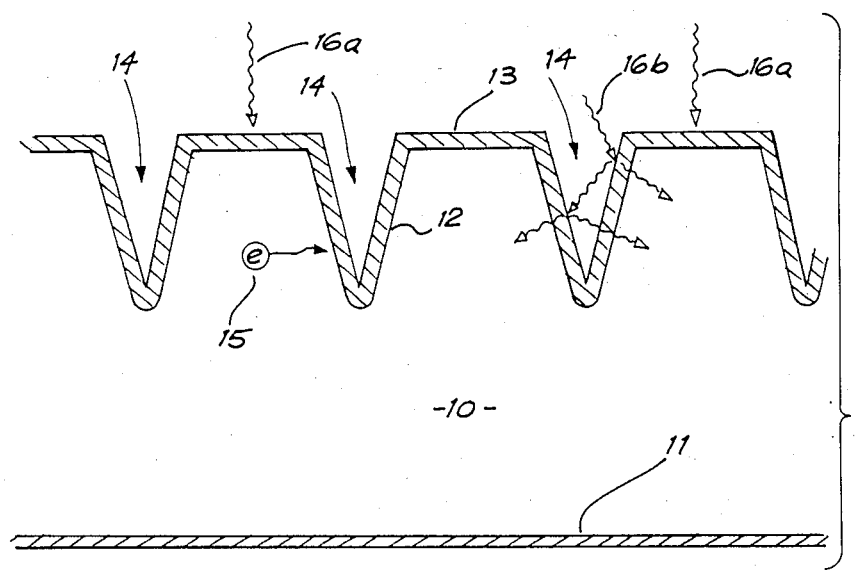

United States Patent [19]

Wenham et al.

[11] Patent Number: 4,626,613
[45] Date of Patent: Dec. 2, 1986

[54] LASER GROOVED SOLAR CELL

[75] Inventors: Stuart R. Wenham; Martin A. Green, both of Sydney, Australia

[73] Assignee: Unisearch Limited, Kensington, Australia

[21] Appl. No.: 683,505

[22] Filed: Dec. 19, 1984

[30] Foreign Application Priority Data

Dec. 23, 1983 [AU] Australia ............................. PG3004

[51] Int. Cl.⁴ ...................... H01L 31/06; H01L 31/18
[52] U.S. Cl. ...................................... 136/255; 29/572; 29/580; 29/583; 156/643; 156/644; 156/647; 219/121 LL; 219/121 LN; 357/20; 357/30; 357/52
[58] Field of Search ......................... 29/572, 580, 583; 219/121 LH, 121 LJ, 121 LK, 121 LL, 121 LN; 136/255, 256; 357/30, 20, 52; 156/643, 644, 647

[56] References Cited

U.S. PATENT DOCUMENTS

| | | | |
|---|---|---|---|
| 3,150,999 | 9/1964 | Rudenberg et al. | 136/256 |
| 3,278,337 | 10/1966 | Gault | 136/255 |
| 4,044,222 | 8/1977 | Kestenbaum | 219/121 LM |
| 4,081,289 | 3/1978 | Campbell, III | 136/246 |
| 4,348,254 | 9/1982 | Lindmayer | 156/647 |
| 4,352,948 | 10/1982 | Kaplow et al. | 136/249 MS |
| 4,409,423 | 10/1983 | Holt | 136/255 |
| 4,427,839 | 1/1984 | Hall | 136/255 |

*Primary Examiner*—Aaron Weisstuch

[57] ABSTRACT

Grooved solar cells are manufactured by scribing the surface of the substrate with a laser scribing tool, and optionally etching the surface to more accurately determine the surface profile, before performing the remainder of the processing steps involved in the production of the solar cell. Top contact shading is avoided by providing holes through the substrate which allow connection to the top layer of the cell to be made from the back of the cell. Resistance to radiation is improved by providing a cell which is grooved on the top and bottom surfaces, the grooves of the bottom surface being spaced between the grooves on the top surface to allow the formation of a relatively thin cell structure. Top layer sheet resistivity is also varied to allow improved efficiency while maintaining the series resistance of the cell substantially unaltered.

7 Claims, 17 Drawing Figures

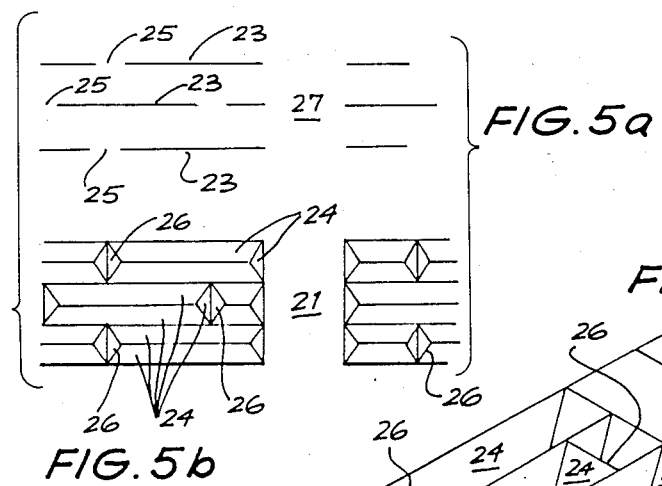
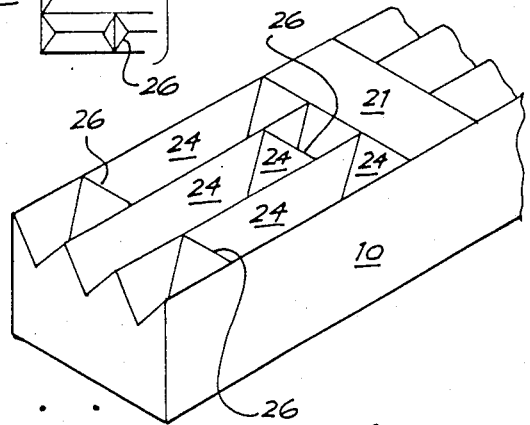
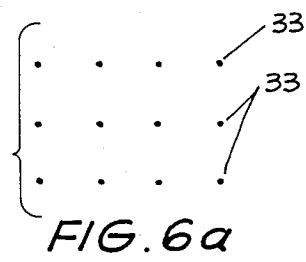
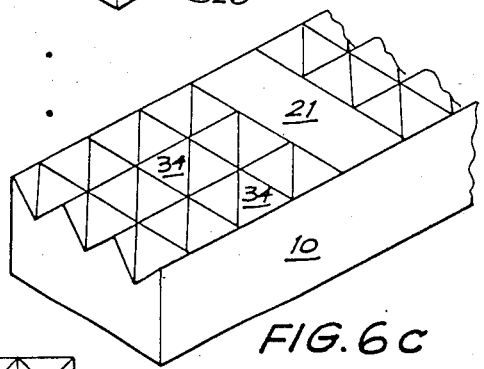
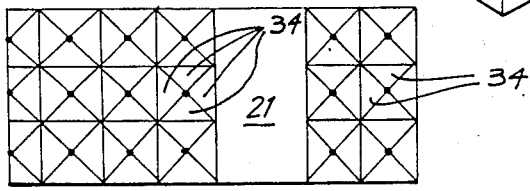

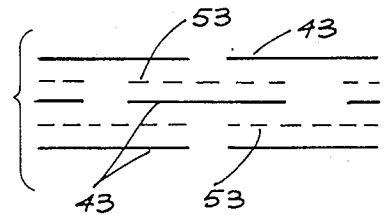
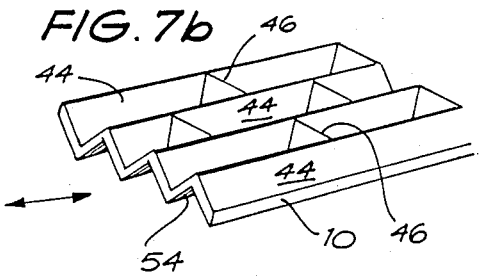
FIG. 7a   FIG. 7b
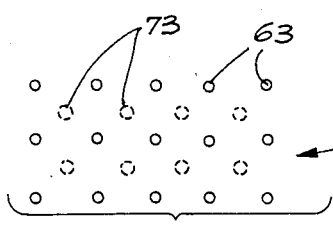
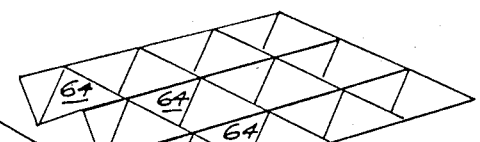
FIG. 8a   FIG. 8b
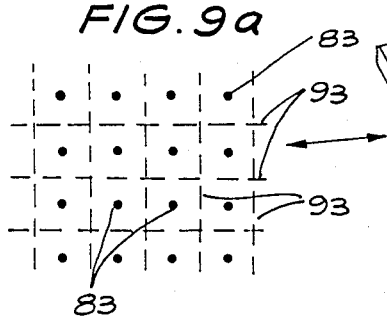
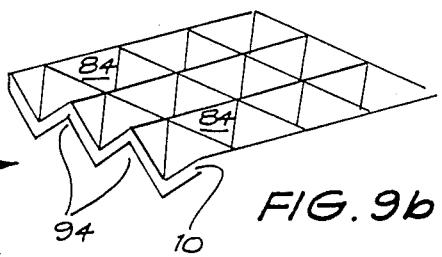
FIG. 9a   FIG. 9b
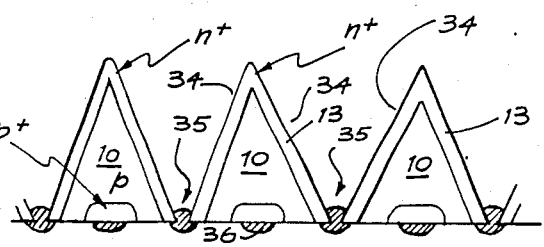
FIG. 10

LASER GROOVED SOLAR CELL

The present invention relates to improvements in the fabrication of solar cells whereby the structure of the cell facilitates collection of photon generated minority carriers from deep within the wafer substrate.

Long wavelength light striking a photocell will penetrate much further into the cell than shorter wavelength light, on average, before being absorbed and therefore minority carriers generated by photons of long wavelength energy must travel much further before being collected by the rectifying junction of the cell. As a result, the chances of a minority carrier resulting from a long wavelength photon, being collected before recombination occurs are greatly reduced over those of a minority carrier resulting from a shorter wavelength photon. This effect is even more pronounced in solar cells used in space, due to the radiation damage which is caused to a solar cell in this environment, and which results in a reduction in minority carrier life times.

In an attempt to overcome the effects of reduced minority carrier life time in the space environment, prior art solar cells have been produced wherein a plurality of grooves were chemically etched into the surface of the substrate prior to the formation of the rectifying junction of the cell, such that the junction provided within the grooves penetrates deep into the bulk of the substrate to aid in the collection of minority carriers formed in the bulk regions.

However, while the formation of grooves in the substrate provides an improvement in short circuit current densities, complications associated with the chemical etching step make this solution too expensive to be of practical use, particularly in the case of mass produced cells for terrestrial use.

A laser scriber has previously been used to separate cells formed on a common wafer, by scribing a groove between a pair of adjacent cells and then breaking the wafer along the scribe line in a similar manner to that used when cutting glass or ceramic tiles. Lasers have also been used to isolate doped regions of a substrate by cutting or drilling an opening between the two adjacent regions to be isolated, however, it has not previously been considered feasible to use lasers in the processing of the active regions of semiconductor devices, due to the damage to the crystal structure caused by the laser.

A first aspect of the present invention relies upon the unexpected result that grooves scribed in the surface of a substrate by way of a laser scriber do not cause a significant deleterious effect upon the solar cell subsequently formed on the substrate, due to crystal damage caused by the laser, but to the contrary, the crystal damage provides gettering sites to which impurities in the substrate migrate during subsequent high temperature processing, thereby enhancing the performance of the solar cell by increasing the life time of minority carriers in the bulk of the substrate.

It has also been found that grooving of the surface of the cell enhances the anti-reflective properties of the cell, as light falling within the grooved area, if it is not initially absorbed by the cell, will be reflected onto another surface of the groove, thereby increasing the possibility of absorption. In order to escape from the grooved area, a photon will need to be reflected several times within the groove, and therefore the probability of escape is low.

The provision of grooves in the substrate also increases greatly the area of the cell junction and additionally provides the possibility of having differing sheet resistivities in the top layer of the cell, with a high resistivity in the region between the grooves to enhance the photovoltaic effect and a lower resistivity within the grooves to decrease the series resistance of the cell and to allow the wider spacing of the contact fingers used to conduct current from the top layer.

According to a first aspect, the present invention consists in a method of manufacturing solar cells, said method comprising the steps of scribing a pattern of holes or grooves in a surface of a semiconductor substrate with a laser scriber and subsequently forming a rectifying junction on said surface, said junction extending into said holes or grooves.

Preferable embodiments of the invention achieve a plurality of parallel grooves or a regular pattern of holes by scribing the surface of the substrate using a laser scriber adapted to simultaneously scribe a repeating pattern of grooves or holes.

In a preferred embodiment of the invention, a chemical etching step is employed between the step of laser scribing and the step of forming the rectifying junction, such that precise control of the shape of holes and grooves is achieved.

Some embodiments of the invention will also make use of holes bored through the substrate during the laser etching step to allow contact to be made with the surface layer of the cell from the rear of the substrate.

Embodiments of the invention may also employ grooving of the rear surface of the substrate to form thin strong cell structures which have high efficiency and are radiation resistant.

According to a second aspect, the present invention consists in a solar cell comprising a substrate, one surface of which has a plurality of grooves or hollows formed therein, and a rectifying junction formed on said surface and extending into said grooves, a top layer of said junction having a sheet resistivity which is greater in the region between the grooves than in the region within the grooves.

According to a third aspect, the present invention consists in a solar cell comprising a substrate, opposite surfaces of which each have a plurality of grooves or hollows formed therein, a rectifying junction being formed on one of said surfaces and extending into the grooves or hollows of that surface.

Figure 2:
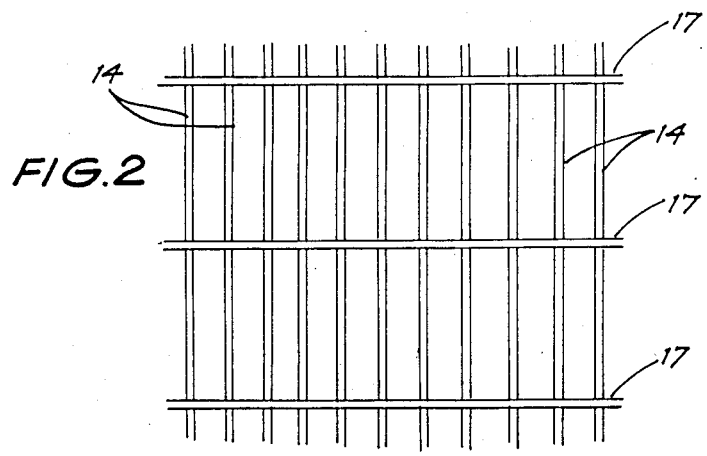
Figure 3:
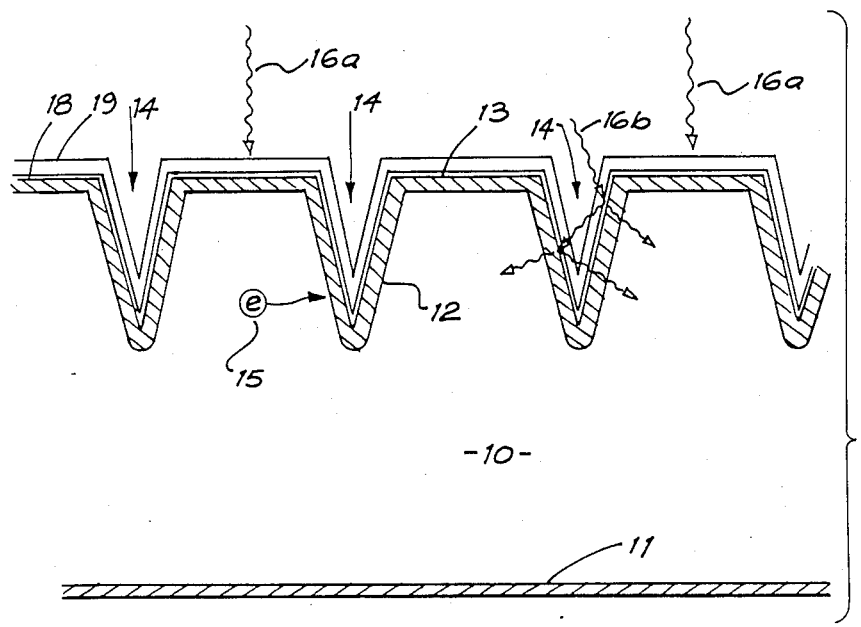
Figure 4:
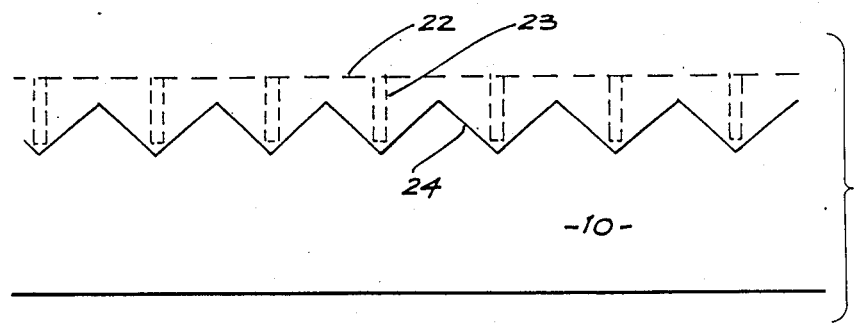

Embodiments of the invention will now be described, by way of example, with reference to the accompanying drawings wherein:

FIG. 1 schematically illustrates a sectional view of a solar cell manufactured in accordance with a first embodiment of the present invention;

FIG. 2 schematically illustrates the solar cell of FIG. 1 when viewed from the top;

FIG. 3 schematically illustrates a sectional view of a solar cell manufactured in accordance with a second embodiment of the present invention;

FIG. 4 schematically illustrates a sectional view of a fully etched substrate according to an embodiment of the invention;

FIGS. 5a-5c schematically illustrate (a) a plan view of a laser scribing pattern; (b) a plan view of a fully etched substrate and (c) a perspective view of a fully etched substrate for a fourth embodiment of the invention;

FIGS. 6a–6c schematically illustrate (a) a plan view of a laser scribing pattern; (b) a plan view of a fully etched substrate and (c) a perspective view of a fully etched substrate for a fifth embodiment of the present invention;

FIGS. 7a–7b, 8a–8b, and 9a–9b schematically illustrate (a) a plan view of a laser scribing pattern and (b) a perspective view of a fully etched substrate for sixth, seventh, and eighth embodiments respectively, of the present invention; and FIG. 10 schematically illustrates an improved method of connecting electrodes to the embodiment of FIG. 8.

Referring to FIG. 1, a substrate 10 is provided with a back contact 11 and a rectifying junction 12 on opposite surfaces, the junction being formed between the substrate 10, which may be of either p-type or n-type semiconductor material, but in this embodiment is p-type material, and a top layer 13 extending over the top surface of the substrate and which is formed of a semiconductor material of opposite impurity type to the substrate 10. Grooves 14 scribed in the top surface of the substrate by a laser scriber, prior to formation of the junction 12, greatly increase the junction area and at the same time facilitate the collection of minority carriers 15 generated deep within the bulk of the substrate, by placing sections of the junction in closer proximity to the region in which these carriers are generated.

Grooves 14 in the cell surface also improve the anti-reflection properties of the cell by acting as light traps. Light 16a striking the surfaces of the cell between the grooves, and which is not absorbed by the cell, will be reflected by the surface and wasted, however, light 16b striking a surface of one of the grooves 14, and which is not absorbed, will generally be reflected onto another surface of the groove, depending upon the angle of incidence of the light and the shape of the grooves. For light 16b falling normal to the top surface of the cell, the number of reflections within the groove 14 will be large, thereby reducing the percentage of light which is reflected out of the grooves.

A further improvement in the anti-reflective properties of the cell may be achieved by filling the grooves with a transparent material such as silicon oxide, and the slope of the groove walls can be optimized after scribing by an unmasked etch of the entire substrate surface.

As well as the improvement in current density due to the physical positioning of the junction within the groove and the increased area of the junction, a further improvement can be attributed to the production of gettering sites during the laser scribing of the surface of the substrate, thereby allowing an increased degree of gettering during subsequent high temperature processing.

Gettering is the process by which impurities are attracted to certain areas of the substrate during high temperature processing, and typical gettering sites are regions of stress causd by diffusion processes and areas of crystal structure damage as caused by laser scribing. The laser scribing process, being a particularly robust process, creates a significant amount of damage to the crystal structure and accordingly a large number of gettering sites will be produced by this process.

The reduction in the number of impurities in the bulk of the substrate, as a result of gettering, has the effect of increasing the minority carrier life time and accordingly increasing the probability of a minority carrier being collected at the rectifying junction 12 before recombination occurs.

The series resistance of the grooved solar cell can also be decreased by selecting a lower sheet resistivity for the portion of the top layer 13 formed in the grooves 14 than for that used in the portion of the top layer between the grooves. In a non-grooved solar cell, manufactured for terrestrial use, the metal contact grid applied to the top layer is often applied by screen printing in order to keep cost to a minimum, however, screen printing imposes restrictions upon the minimum dimensions achievable, these being a minimum contact width of typically 150 $\mu$m and a minimum spacing of at least 3 mm. With these contact dimensions, it is necessary to provide a top layer sheet resistivity in the order of 25$\Omega/\square$ to 50$\Omega/\square$ to minimize lateral resistance; however, such low values of sheet resistivity degrade the photovoltaic properties of the cell. This problem is less pronounced in cells produced for use in space, as in these cells a more sophisticated method of contact formation is used which allows the use of thinner contacts having a closer spacing, such that higher sheet resistivities can be used without degrading the series resistance of the cell. However, the method of contact formation used in space cells adds considerably to their manufacturing costs.

In the case of grooved cells made according to the present invention, sheet resistivities in the order of 25$\Omega/\square$ to 50$\Omega/\square$ can be provided for that portion of the top layer 13 within the grooves 14, while sheet resistivities in the order of 100–200$\Omega/\square$ can be achieved in the top layer portions between the grooves. Typically the groove would be in the order of 50 $\mu$m wide and the space between the grooves would be 100 $\mu$m, the metal contact fingers 17 (see FIG. 2) running in the direction normal to the grooves and having the dimensions previously stated for screen printed contacts.

A lower sheet resistivity can be achieved in the grooved regions in numerous ways, some examples of which are:

(a) By using a thickness dependent spin diffusion source, or alternatively a spray-on diffusion source which upon application will automatically give a thicker layer in the groove.

(b) By providing a heavy diffusion over the entire surface, which is followed by a chemical or plasma etch of the exposed regions to increase sheet resistivity.

(c) By using a laser to locally heat the silicon subsequent to the application of a diffusion source.

The low sheet resistivity of the top layer in the grooved regions will have a detrimental effect on the response of the cell to short wavelength (blue) light due to the increased top layer thickness and therefore the sheet resistivity chosen will be a compromise between a value which gives low series resistance and a value which does not seriously degrade the response to blue light. It will be recognised, however, that while low sheet resistivity will degrade the response to blue light, the beneficial effects of low series resistance and improved current density due to increased junction area and the provision of a portion of the junction deep within the bulk of the substrate, will more than make up for this degradation. Further, the low sheet resistivity in the grooves will not seriously affect the response of the cell to long wavelength (red) light.

The use of a low sheet resistivity top layer in the grooved regions of space cells will also allow the contact fingers in these cells to be spaced more widely, thereby, allowing the use of less costly formation process and accordingly reducing the manufacturing costs of the cell.

Referring now to FIG. 3, the metal contact fingers 17 in FIG. 2 may be replaced by Conductor-Insulator-Silicon (CIS) contacts wherein the top layer 13 is a lightly doped region, the rectifying effect of the junction 12 being reinforced by the MIS contact comprising a thin layer of insulation 18 over the top layer and a metal, or a highly doped polycrystalline, contact finger 19 formed over the insulation layer 18. The fingers 19 will be arranged in a similar configuration to the metal fingers 17 shown in FIG. 2, however, the insulation layer may either be formed over the entire surface of the cell, by using a transparent insulation layer such as a silicon oxide, or alternatively the insulation layer may be only formed in the region of the conductor finger 19.

Referring to FIG. 4 of the drawings, reflection properties of the laser groove cell can be optimised by arranging the grooving so that the sloping groove walls intersect with one another, thereby substantially eliminating the flat intergroove regions illustrated in FIGS. 1, 2, and 3. With the structure of FIG. 4, the only ungrooved regions required are flat paths 21 (refer to FIGS. 5b and 5c) provided for the top contact metallisation.

As illustrated in FIG. 4, very precise control of such structures can be obtained in single crystal material by using chemical etches with anisotropic properties, combined with laser grooving. For example, dilute caustic soda solutions etch silicon very slowly in the [111] crystal direction but etch very rapidly in other directions. Therefore, if the surface 22 of a wafer has [100] orientation and is grooved by a laser to form grooves 23 and then subsequently etched in dilute caustic soda solutions, the silicon is very quickly etched away until the [111] crystal planes are exposed to form the grooved surface 24 of FIG. 4. Once the [111] crystal planes, coinciding with the faces of the surface 24, are exposed, the rate of etching slows markedly, allowing precise control of the final etched surface shape, thereby allowing the resulting surface geometry of the device to be precisely defined by the depth and spacing of the original grooves 23.

Regardless of the method used to control the slope of the groove walls, interesting and useful structures can be obtained by the use of intermittent grooving of the cell surface and several such structures will now be described with reference to FIGS. 5, 6, 7, 8, and 9.

Referring to FIG. 5, a "slat" structure is illustrated wherein the laser grooving 23 is intermittently broken by gaps 25 in order to provide strengthening ribs or struts 26 in the final etched substrate of FIG. 5(c). In addition, a larger gap 27 in the laser grooving pattern results in the flat path 21 in the final etched substrate which provides a location for top contact metallization in the completed cell.

Turning to FIG. 6, the laser grooves 23 of FIG. 5 are replaced by holes 33 which are bored by the laser scriber in the square pattern illustrated in FIG. 6a, such that after etching, an inverted pyramid structure as illustrated in FIG. 6b and FIG. 6c is produced with the top surface 34 of the inverted pyramid structure again corresponding to the [111] crystal planes of the substrate.

Combined grooving of the front and rear surfaces of the wafer and subsequent etching gives rise to a further class of cells which have been termed "crinkle cut" cells. Referring to FIG. 7, if a grooving pattern 43, similar to the pattern 23 of FIG. 5a is provided in a top surface of the wafer and a second grooving pattern 53, again similar to the pattern 23 of FIG. 5a, is provided in the bottom surface of the wafer and the wafer is subsequently etched, a structure of the form illustrated in FIG. 7b will be produced, wherein parallel grooves run along both sides of the wafer, the grooves in one side corresponding with the peaks in the other side of the wafer to provide a corrugated structure having strengthening struts or ribs 46 (underside ribs not shown) and the surfaces 44 and 54 each corresponding to [111] crystal planes of the substrate.

FIGS. 8 and 9 illustrate additional "crinkle cut" structures, the structure of FIG. 8 comprising inverted pyramids similar to those of FIG. 6 on each side of the wafer, with the pyramids on one side of the wafer being offset from those on the other side, while the structure of FIG. 9 has inverted pyramids on the top surface and a crossed groove structure on the bottom surface to provide an etched wafer structure having a substantially constant thickness as is the case with the structure of FIG. 7. The structures of FIG. 7 and FIG. 9 allow very thin strong cells having good reflection properties to be fabricated and these structures will assist in the production of very high efficiency cells with good radiation resistance. The structure of FIG. 8 on the other hand will produce cells having good reflection properties with moderate thickness but great strength.

The laser grooving technique can also be used to produce structures which have holes extending right through the cell from one side to the other. The structures illustrated in FIGS. 6, 8, and 9 are particularly suited to this technique. The advantage of a structure which employs holes passing completely through the cell is that it is then possible to have both contacts to the cell made on the rear surface of the cell, thereby avoiding the losses associated with top contact shading. For example, a section of a structure similar to that of FIG. 6 is illustrated in FIG. 10, wherein the grooving is much greater than that previously illustrated such that the apex 35 of inverted pyramids extends to the back surface of the wafer. With this structure, once the top layer 13 has been formed, metallised top contacts 36 can be provided from the back of the cell at each apex point. This technique allows an improvement in overall cell efficiency by removing the problem of top contract shading which would otherwise occur, while at the same time allowing connections to the top contacts to be of greater current carrying capacity, as the trade off between current carrying capacity and degree of shading is no longer necessary.

The laser used to produce any of the previous laser groove structures can be programmed very simply to punch holes through the cell in any prescribed location so that a variety of such punch through structures are possible with this approach and clearly the punch through technique can be used with any of the structures previously described.

A preferred method of manufacturing laser groove cells requires starting with a silcon wafer of desired surface orientation (for example [100]) and then grooving one or both sides of the cell in the desired pattern using a laser. The wafer is then etched in an appropriate chemical solution to define the shape of the walls of the groove. Thereafter, cell processing proceeds as it would with prior art devices. The top junction is formed by the diffusion of an appropriate dopant and, if desired, a back surface field region is formed at the rear of the cell. Top and rear contact metallization can then be formed by any chosen sequence, e.g. vacuum deposition, screen printing, or electroplating, as can the antireflection coating.

It will be recognised by persons skilled in the art that numerous variations and modifications may be made to the invention as described above without departing from the spirit or scope of the invention as broadly described.

We claim:

1. A solar cell comprising a substrate, a front surface of which has a plurality of grooves or hollows formed therein, and a rectifying junction formed on said surface and extending into said grooves, a top layer of said junction having a sheet resistivity which is greater in the region between the grooves than in the region within the grooves.

2. A solar cell as claimed in claim 1, wherein the sheet resistivity of the top layer within the grooves is in the order of $25$–$50\Omega/\square$ while sheet resistivity of the top layer between the grooves is in the order of $100$–$200\Omega/\square$.

3. A solar cell of claim 2, wherein said grooves comprise through holes provided in said substrate, the lower resistivity regions of the top layer extending into the through holes and along a portion of the rear surface of the cell, metallized contacts to said lower resistivity regions being provided on said rear surface of the substrate to make low resistance electrical contact with the top layer of the junction.

4. A solar cell of claim 1, wherein said grooves comprise through holes provided in said substrate, the lower resistivity regions of the top layer extending into the through holes and along a portion of the rear surface of the cell, metallized contacts to said lower resistivity regions being provided on said rear surface of the substrate to make low resistance electrical contact with the top layer of the junction.

5. A method of manufacturing solar cells, said method comprising the steps of scribing a pattern of grooves or holes in the front surface of a semiconductor substrate with a laser scriber, subsequently etching said grooves or holes with a chemical etchant, said etchant being selected to etch the base region of said grooves or holes more slowly than the top region to convert said grooves to V-shaped troughs and to convert said holes to shapes approximating inverted pyramids, and subsequently forming a rectifying junction on said surface, said junction extending into said troughs or inverted pyramids.

6. The method of claim 5, wherein said laser scriber is used to bore holes through said substrate during the laser scribing step and the junction extends through said holes to cover a portion of the rear surface thereof such that contact can be made with the top layer of the cell from the rear of said substrate.

7. The method of claim 5, wherein grooves or holes are also laser scribed into the rear surface of said substrate prior to the chemical etching step, these grooves or holes being interposed between the grooves or holes formed in the top surface such that, after the chemical etching step, a structure of small average thickness, high strength, and low surface reflectance results.

* * * * *